(12) United States Patent
Ju

(10) Patent No.: US 12,538,449 B2
(45) Date of Patent: Jan. 27, 2026

(54) ELECTRONIC APPARATUS, DYNAMIC CONTROL HEAT DISSIPATION METHOD AND DYNAMIC HEAT DISSIPATION CONTROL SYSTEM

(71) Applicant: Wistron Corporation, New Taipei (TW)

(72) Inventor: Yu-Tang Ju, New Taipei (TW)

(73) Assignee: Wistron Corporation, New Taipei (TW)

( * ) Notice: Subject to any disclaimer, the term of this patent is extended or adjusted under 35 U.S.C. 154(b) by 311 days.

(21) Appl. No.: 17/723,441

(22) Filed: Apr. 18, 2022

(65) Prior Publication Data

US 2023/0232573 A1 Jul. 20, 2023

(30) Foreign Application Priority Data

Jan. 18, 2022 (TW) .................................. 111102044

(51) Int. Cl.
*H05K 7/20* (2006.01)
(52) U.S. Cl.
CPC ..... *H05K 7/20209* (2013.01); *H05K 7/20281* (2013.01)
(58) Field of Classification Search
CPC ........... H05K 7/20209; H05K 7/20281; H05K 7/20727; H05K 7/20836; H05K 7/20136; H05K 7/20218; Y02D 10/00; G06F 1/206
See application file for complete search history.

(56) References Cited

U.S. PATENT DOCUMENTS

| 10,268,248 | B2 | 4/2019 | Hovis et al. |
| 10,645,847 | B2 | 5/2020 | Edwards et al. |
| 10,698,460 | B2 | 6/2020 | Ping |
| 11,216,048 | B1 * | 1/2022 | Lin .......................... G06F 1/324 |

(Continued)

FOREIGN PATENT DOCUMENTS

| AU | 2017374057 | 7/2018 |
| CN | 109564454 | 8/2022 |
| TW | 201833722 | 9/2018 |

OTHER PUBLICATIONS

H. Chen, Y. Han, G. Tang and X. Zhang, "A Dynamic Control System for Server Processor Direct Liquid Cooling," in IEEE Transactions on Components, Packaging and Manufacturing Technology, vol. 10, No. 5, pp. 786-794, May 2020, doi: 10.1109/TCPMT.2020.2986796. (Year: 2020).*

(Continued)

*Primary Examiner* — Thomas C Lee
*Assistant Examiner* — Tyler Dean Hedrick
(74) *Attorney, Agent, or Firm* — JCIPRNET

(57) ABSTRACT

Provided is an electronic apparatus, including a heat generating element, a heat dissipation module, and a control unit. The heat dissipation module is adapted for performing heat dissipation on the heat generating element. The control unit is coupled to the heat dissipation module and is adapted for measuring temperature variation of at least one temperature module and state variation of at least one system component and for adjusting the heat dissipation module via a control signal based on the state variation and the temperature variation. In addition, a dynamic heat dissipation control method and a dynamic heat dissipation control system are also provided.

17 Claims, 8 Drawing Sheets

(56) References Cited

U.S. PATENT DOCUMENTS

| | | |
|---|---|---|
| 11,460,898 B2 | 10/2022 | Ping |
| 2003/0001605 A1 | 1/2003 | Jones et al. |
| 2018/0032114 A1* | 2/2018 | Hovis ................ H05K 7/20836 |
| 2018/0260007 A1 | 9/2018 | Ping |
| 2020/0301489 A1 | 9/2020 | Ping |
| 2021/0149465 A1 | 5/2021 | Hiltner et al. |
| 2021/0325947 A1 | 10/2021 | Shabbir et al. |
| 2022/0326748 A1 | 10/2022 | Ping |
| 2022/0418161 A1* | 12/2022 | Gao .................... H05K 7/20327 |
| 2023/0127216 A1* | 4/2023 | He .................... H05K 7/20836 |
| | | 700/300 |
| 2024/0137861 A1* | 4/2024 | Eleftheriadis .......... G06N 3/006 |

OTHER PUBLICATIONS

"Office Action of Taiwan Counterpart Application", issued on Dec. 12, 2022, p. 1-p. 15.

* cited by examiner

ELECTRONIC APPARATUS, DYNAMIC CONTROL HEAT DISSIPATION METHOD AND DYNAMIC HEAT DISSIPATION CONTROL SYSTEM

CROSS-REFERENCE TO RELATED APPLICATION

This application claims the priority benefit of Taiwan application serial no. 111102044, filed on Jan. 18, 2022. The entirety of the above-mentioned patent application is hereby incorporated by reference herein and made a part of this specification.

BACKGROUND

Technical Field

The disclosure relates to an electronic apparatus, a heat dissipation method, and a control system, and more particularly to an electronic apparatus including a heat dissipation module as well as a corresponding dynamic control heat dissipation method and a dynamic heat dissipation control system.

Description of Related Art

In most cases, a server performs heat dissipation for a chip therein by using a fan. A good control of fan rotation speed can help the server save power and reduce noise effectively. The fan rotation speed is commonly controlled by using a closed loop proportional-integral and derivative (PID) control unit. However, when chip usage rate and power consumption fluctuate greatly, PID parameters not optimized lead to an excessively low rate of variation in the fan rotation speed. In that case, when confronted with a sudden spike in the chip power consumption, a mismatch between the increase of the fan rotation speed and the variation in chip temperature may result in an overshoot of the chip temperature and cause underclocking, which affects server performance. In addition, if the PID parameters not optimized lead to an excessively high rate of variation in the fan rotation speed, when confronted with a sudden spike or dive in the chip power consumption, the overly dramatic variation in the fan rotation speed may cause an oscillation of rotation speed, resulting in power consumption and noise problems.

SUMMARY

The disclosure provides an electronic apparatus, a dynamic control heat dissipation method, and a dynamic heat dissipation control system, which may control a heat dissipation module in a favorable way for the electronic apparatus to have good performance with power saving and noise reduction effects.

The electronic apparatus of the disclosure includes a heat generating element, a heat dissipation module, and a control unit. The heat dissipation module is adapted for performing heat dissipation on the heat generating element. The control unit is coupled to the heat dissipation module and is adapted for measuring temperature variation of at least one temperature module and state variation of at least one system component and for adjusting the heat dissipation module via a control signal based on the state variation and the temperature variation.

In an embodiment of the disclosure, the control unit is combined with a neural network to dynamically adjust the heat dissipation module.

In an embodiment of the disclosure, the temperature variation of the temperature module corresponds to temperature variation of the heat generating element, and the state variation of the system component corresponds to power consumption variation of the heat generating element. In a first temperature variation state of the heat generating element, the control unit controls an operation state of the heat dissipation module according to the power consumption variation of the heat generating element. In a second temperature variation state of the heat generating element, the control unit controls the operation state of the heat dissipation module according to the temperature variation of the heat generating element. The first temperature variation state is a first heating state, and the second temperature variation state is a second heating state.

In an embodiment of the disclosure, the heat generating element heats up from an initial temperature to a first target temperature in the first temperature variation state, and the heat generating element heats up from the first target temperature to a second target temperature in the second temperature variation state.

In an embodiment of the disclosure, the control unit includes an open loop circuit and a closed loop circuit. The control unit controls the operation state of the heat dissipation module via the open loop circuit in the first temperature variation state and controls the operation state of the heat dissipation module via the closed loop circuit in the second temperature variation state.

In an embodiment of the disclosure, when a temperature of the heat generating element is not greater than a first target temperature, the control unit controls the operation state of the heat dissipation module via the open loop circuit, and when the temperature of the heat generating element is greater than the first target temperature, the control unit controls the operation state of the heat dissipation module via the closed loop circuit, such that the temperature of the heat generating element approaches a second target temperature, which is greater than the first target temperature.

In an embodiment of the disclosure, the heat dissipation module is a fan. The fan and the heat generating element are disposed in a body of the electronic apparatus, and the operation state of the heat dissipation module is a rotation speed of the fan.

In an embodiment of the disclosure, the heat dissipation module is a coolant distribution device. The heat generating element is disposed in a body of the electronic apparatus, and the coolant distribution device is externally connected to the body. The operation state of the heat dissipation module is a rotation speed of a pump of the coolant distribution device.

In an embodiment of the disclosure, the heat dissipation module is a water-cooling pump. The water-cooling pump and the heat generating element are disposed in a body of the electronic apparatus, and the operation state of the heat dissipation module is a rotation speed of the water-cooling pump.

In an embodiment of the disclosure, the electronic apparatus includes a sensing module. The sensing module is coupled to the control unit, and the sensing module is adapted for sensing the power consumption of the heat generating element and the temperature of the heat generating element.

The dynamic control heat dissipation method of the disclosure is adapted for an electronic apparatus, including the following steps. Temperature variation of at least one temperature module and state variation of at least one system component are measured. A heat dissipation module is adjusted via a control signal based on the state variation and the temperature variation.

In an embodiment of the disclosure, the dynamic control heat dissipation method further includes combining a neural network to dynamically adjust the heat dissipation module.

In an embodiment of the disclosure, the dynamic control heat dissipation method includes the following steps. The heat dissipation module performs heat dissipation on a heat generating element of the electronic apparatus. The temperature variation of the temperature module corresponds to temperature variation of the heat generating element, and the state variation of the system component corresponds to power consumption variation of the heat generating element. In a first temperature variation state of the heat generating element, a control unit controls an operation state of the heat dissipation module according to the power consumption variation of the heat generating element. In a second temperature variation state of the heat generating element, the control unit controls the operation state of the heat dissipation module according to the temperature variation of the heat generating element.

In an embodiment of the disclosure, the heat generating element heats up from an initial temperature to a first target temperature in a first temperature variation state, and the heat generating element heats up from the first target temperature to a second target temperature in a second temperature variation state.

In an embodiment of the disclosure, the first temperature variation state is a first heating state, and the second temperature variation state is a second heating state.

In an embodiment of the disclosure, the control unit includes an open loop circuit and a closed loop circuit. The control unit controls the operation state of the heat dissipation module via the open loop circuit in the first temperature variation state and controls the operation state of the heat dissipation module via the closed loop circuit in the second temperature variation state.

In an embodiment of the disclosure, when a temperature of the heat generating element is not greater than a first target temperature, the control unit controls the operation state of the heat dissipation module via the open loop circuit, and when the temperature of the heat generating element is greater than the first target temperature, the control unit controls the operation state of the heat dissipation module via the closed loop circuit, such that the temperature of the heat generating element approaches a second target temperature, which is greater than the first target temperature.

In an embodiment of the disclosure, the open loop circuit controls the operation state of the heat dissipation module according to a training model.

In an embodiment of the disclosure, in the heat dissipation method, a sensing module senses at least one of the power consumption of the heat generating element, the temperature of the heat generating element, an ambient temperature, and an ambient pressure.

The dynamic heat dissipation control system of the disclosure is adapted for a heat dissipation module of an electronic apparatus, and the heat dissipation module is adapted for performing heat dissipation on a heat generating element of the electronic apparatus. The control system includes a control unit. The control unit is coupled to the heat dissipation module and is adapted for measuring temperature variation of at least one temperature module and state variation of at least one system component, and for adjusting a heat dissipation module via a control signal based on the state variation and the temperature variation. The control unit is combined with a neural network to dynamically adjust the heat dissipation module. The temperature variation of the at least one temperature module corresponds to temperature variation of the heat generating element, and the state variation of the at least one system component corresponds to power consumption variation of the heat generating element. The control unit controls an operation state of the heat dissipation module according to the power consumption variation of the heat generating element in a first temperature variation state of the heat generating element, and the control unit controls the operation state of the heat dissipation module according to the temperature variation of the heat generating element in a second temperature variation state of the heat generating element. The first temperature variation state is a first heating state, and the second temperature variation state is a second heating state.

DESCRIPTION OF THE EMBODIMENTS

Figure 1:
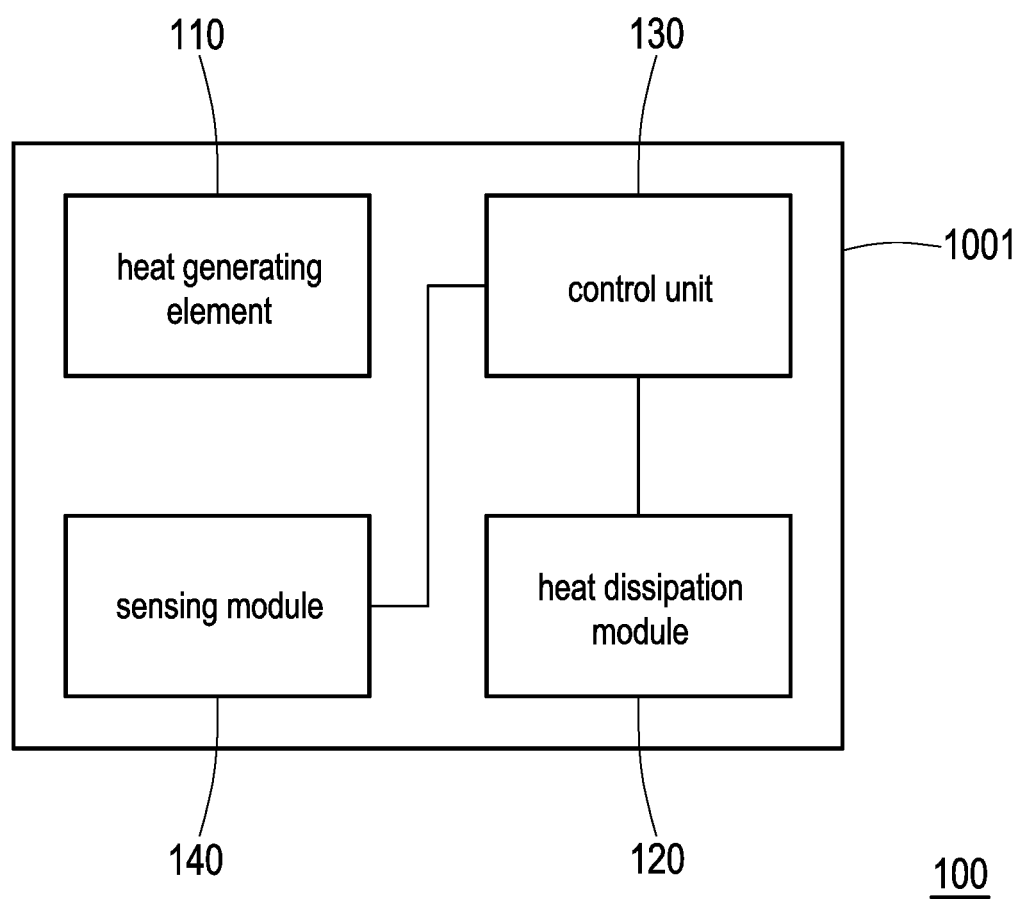
FIG. 1 is a schematic diagram of an electronic apparatus according to an embodiment of the disclosure.

FIG. 1 is a schematic diagram of an electronic apparatus according to an embodiment of the disclosure. With reference to FIG. 1, an electronic apparatus 100 of this embodiment is, for example, a server, including a heat generating element 110, a heat dissipation module 120, and a control unit 130. The heat generating element 110, the heat dissipation module 120, and the control unit 130 are disposed in a body 1001 of the electronic apparatus 100. The heat generating element 110 is, for example, a chip in the server, and the heat dissipation module 120 is, for example, a fan, and is suitable for performing heat dissipation on the heat generating element 110. The control unit 130 includes, for example, a control circuit, and is coupled to the heat dissipation module 120.

Figure 2:
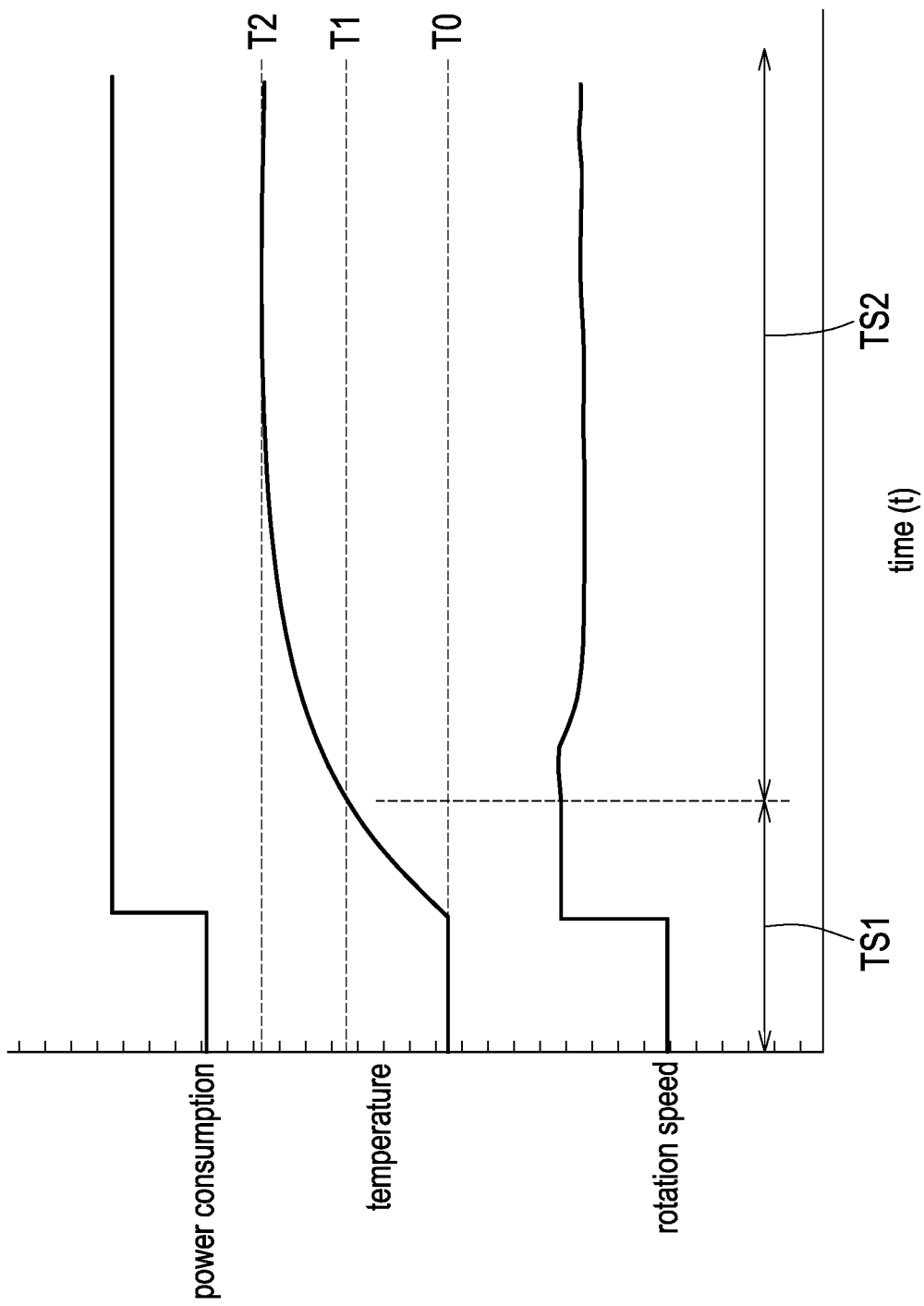
FIG. 2 is a curve diagram of the temperature and power consumption of a heat generating element and the rotation speed of a heat dissipation module in FIG. 1.

FIG. 2 is a curve diagram of the temperature and power consumption of the heat generating element and the rotation speed of the heat dissipation module in FIG. 1. Among that, "power consumption" represents the power consumption of the heat generating element 110, "temperature" represents the temperature of the heat generating element 110, and "rotation speed" represents the rotation speed of the heat dissipation module 120. With reference to FIG. 2, the heat generating element 110 heats up from an initial temperature T0 to a first target temperature T1 in a first temperature variation state (e.g., a first heating state) TS1. The heat generating element 110 heats up from the first target temperature T1 to a second target temperature T2 in a second temperature variation state (e.g., the second heat generating state) TS2. The second target temperature T2 is, for example, an expected optimal working temperature of the chip (the heat generating element 110), and the first target temperature T1 is, for example, a temperature slightly lower than the second target temperature T2. For example, the first target temperature T1 is 10 degrees (Celsius) lower than the second target temperature T2.

Figure 3A:
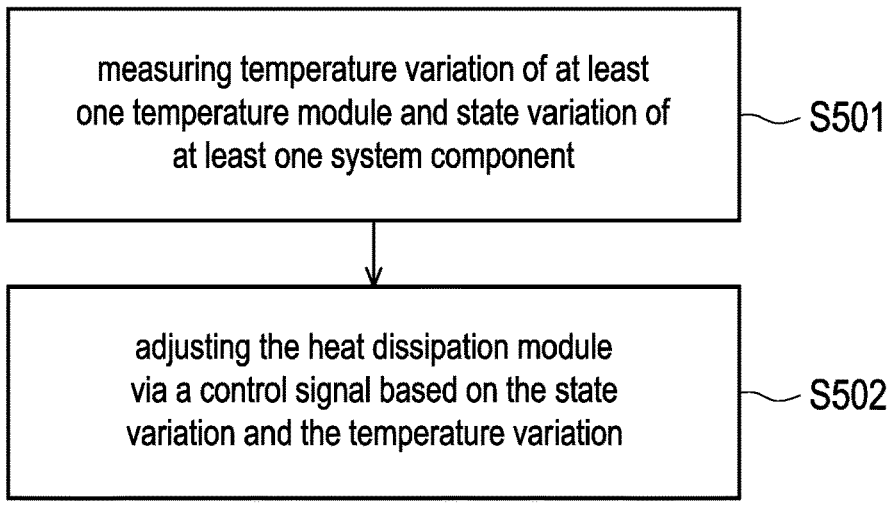
FIG. 3A is a flowchart of a dynamic control heat dissipation method corresponding to the electronic apparatus in FIG. 1.

FIG. 3A is a flowchart of a dynamic control heat dissipation method corresponding to the electronic apparatus in FIG. 1. Based on the configuration of the electronic apparatus 100 in the foregoing embodiment, the corresponding dynamic control heat dissipation method may include the following steps shown in FIG. 3A. The temperature variation of at least one temperature module and the state variation of at least one system component are measured (step S501). Next, the heat dissipation module is adjusted via a control signal based on the state variation and the temperature variation (step S502). The temperature variation of the temperature module corresponds to the temperature variation of the heat generating element 110, and the state variation of the system component corresponds to the power consumption variation of the heat generating element 110. Specifically, the temperature module may be the heat generating element 110 itself, such that the temperature of the temperature module is the temperature of the heat generating element 110. Alternatively, the temperature module may be a component in any form connected to the heat generating element 110 for temperature measurement, such that the temperature of the heat generating element 110 may be inferred by measuring the temperature of the temperature module. In addition, the system component may be the heat generating element 110 itself, such that the state of the system component is the state (power consumption) of the heat generating element 110. Alternatively, the system component may be an electronic component in any form coupled to the heat generating element 110, such that the state (power consumption) of the heat generating element 110 may be inferred by measuring the electrical properties of the system component.

Figure 3B:
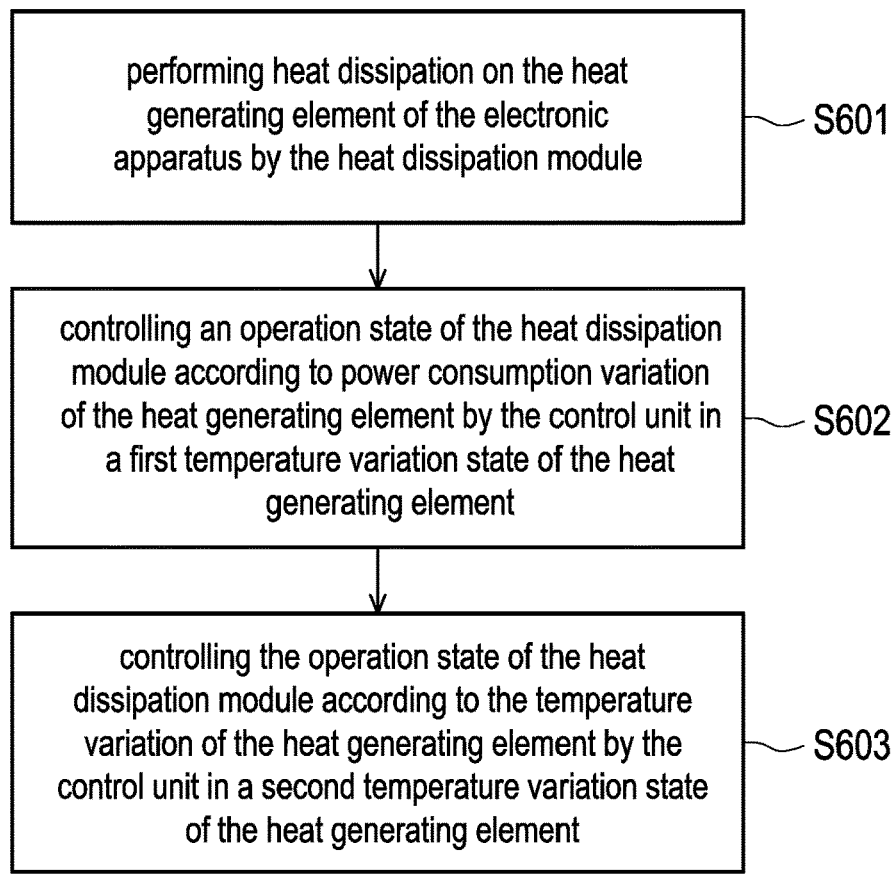
FIG. 3B is a specific flowchart of the dynamic control heat dissipation method corresponding to the electronic apparatus in FIG. 1.

FIG. 3B is a specific flowchart of the dynamic control heat dissipation method corresponding to the electronic apparatus in FIG. 1. A more specific dynamic control heat dissipation method may include the following steps shown in FIG. 3B. The heat dissipation module 120 performs heat dissipation on the heat generating element 110 of the electronic apparatus 100 (step S601). In the first temperature variation state TS1 of the heat generating element 110, the control unit 130 controls the operation state of the heat dissipation module 120 according to the power consumption variation of the heat generating element 110 (step S602). In the second temperature variation state TS2 of the heat generating element 110, the control unit 130 controls the operation state of the heat dissipation module 120 according to the temperature variation of the heat generating element 110 (step S603).

As described above, this embodiment distinguishes the heating of the heat generating element 110 into the first temperature variation state TS1 and the second temperature variation state TS2. In the first temperature variation state TS1 where the temperature increases rapidly, the control unit 130 controls the heat dissipation module 120 according to the power consumption variation of the heat generating element 110, instead of the temperature variation of the heat generating element 110. The temperature of the heat generating element 110 is a lagging indicator reflecting the physical behavior of heat transfer; in contrast, the power consumption of the heat generating element 110 is a leading indicator reflecting the physical behavior of heat transfer instantly. Therefore, as described above, first controlling the heat dissipation module 120 according to the power consumption variation of the heat generating element 110 in the first temperature variation state TS1 may allow the heat dissipation module 120 to have relatively real-time and stable reactions in the first temperature variation state TS1. After the heat generating element 110 enters the second temperature variation state TS2 where the temperature changes in a relatively moderate way, the control unit 130 controls the heat dissipation module 120 according to the temperature variation of the heat generating element 110 instead, so as to continuously and accurately control the operation state of the dissipation module 120 in response to the actual temperature of the heat generating element 110 to keep the heat generating element 110 at the second target temperature T2.

The above description takes the heating process of the heat generating element as an example, but the control method of this embodiment may also be used for the cooling process of the heat generating element. Specifically, the temperature variation state TS1 and the second temperature variation state TS2 may also be respectively regarded as a first cooling state and a second cooling state. When the heat generating element 110 begins to cool down, the control unit 130 controls the heat dissipation module 120 according to the temperature variation of the heat generating element 110 in the second temperature variation state TS2 where the temperature drops in a relatively moderate way. In the first temperature variation state TS1 where the temperature drops more rapidly, the control unit 130 controls the heat dissipation module 120 according to the power consumption variation of the heat generating element 110, instead of the temperature variation of the heat generating element 110. The temperature of the heat generating element 110 is a lagging indicator reflecting the physical behavior of heat transfer; in contrast, the power consumption of the heat generating element 110 is a leading indicator reflecting the physical behavior of heat transfer instantly. Therefore, controlling the heat dissipation module 120 according to the power consumption variation of the heat generating element 110 in the first temperature variation state TS1 may allow the heat dissipation module 120 to have relatively real-time and stable reactions in the first temperature variation state TS1.

Figure 4:
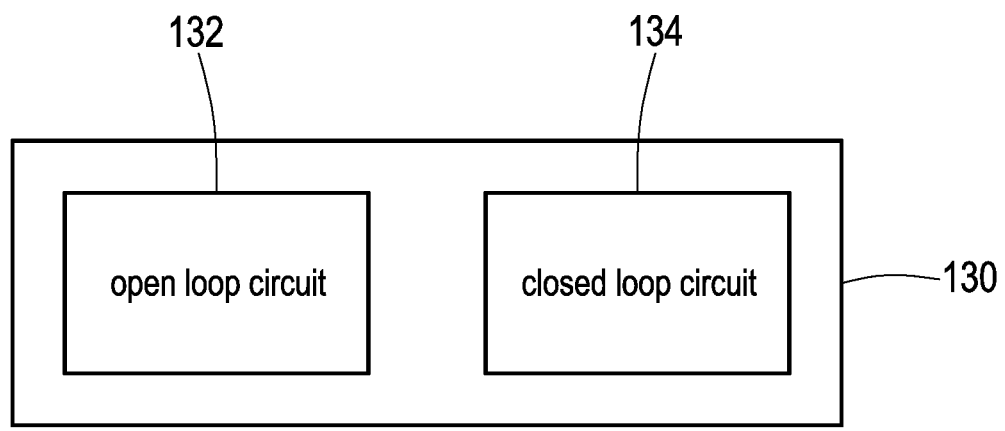
FIG. 4 is a schematic diagram of a control unit in FIG. 1.

FIG. 4 is a schematic diagram of the control unit of FIG. 1. The control unit 130 of the embodiment includes an open loop circuit 132 and a closed loop circuit 134 as shown in FIG. 4. The control unit 132 in the first temperature variation state TS1 shown in FIG. 2, for example, controls the operation state of the heat dissipation module 120 via the open loop circuit 132 according to the power consumption of the heat generating element 110, and the control unit 132 in the second temperature variation state TS2 shown in FIG. 2, for example, controls the operation state of the heat dissipation module 120 via the closed loop circuit 134 according to the temperature of the heat generating element 110. In other words, when the temperature of the heat generating element 110 is not greater than the first target temperature T1, the control unit 130 controls the operation state of the heat dissipation module 120 via the open loop circuit 132 according to the power consumption of the heat generating element 110, and when the temperature of the heat generating element 110 is greater than the first target temperature T1, the control unit 130 controls the operation state of the heat dissipation module 120 via the closed loop circuit 134 according to the temperature of the heat generating element 110, such that the temperature of the heat generating element 110 approaches the second target temperature T2. The second target temperature T2 is greater than the first target temperature T1.

Figure 5:
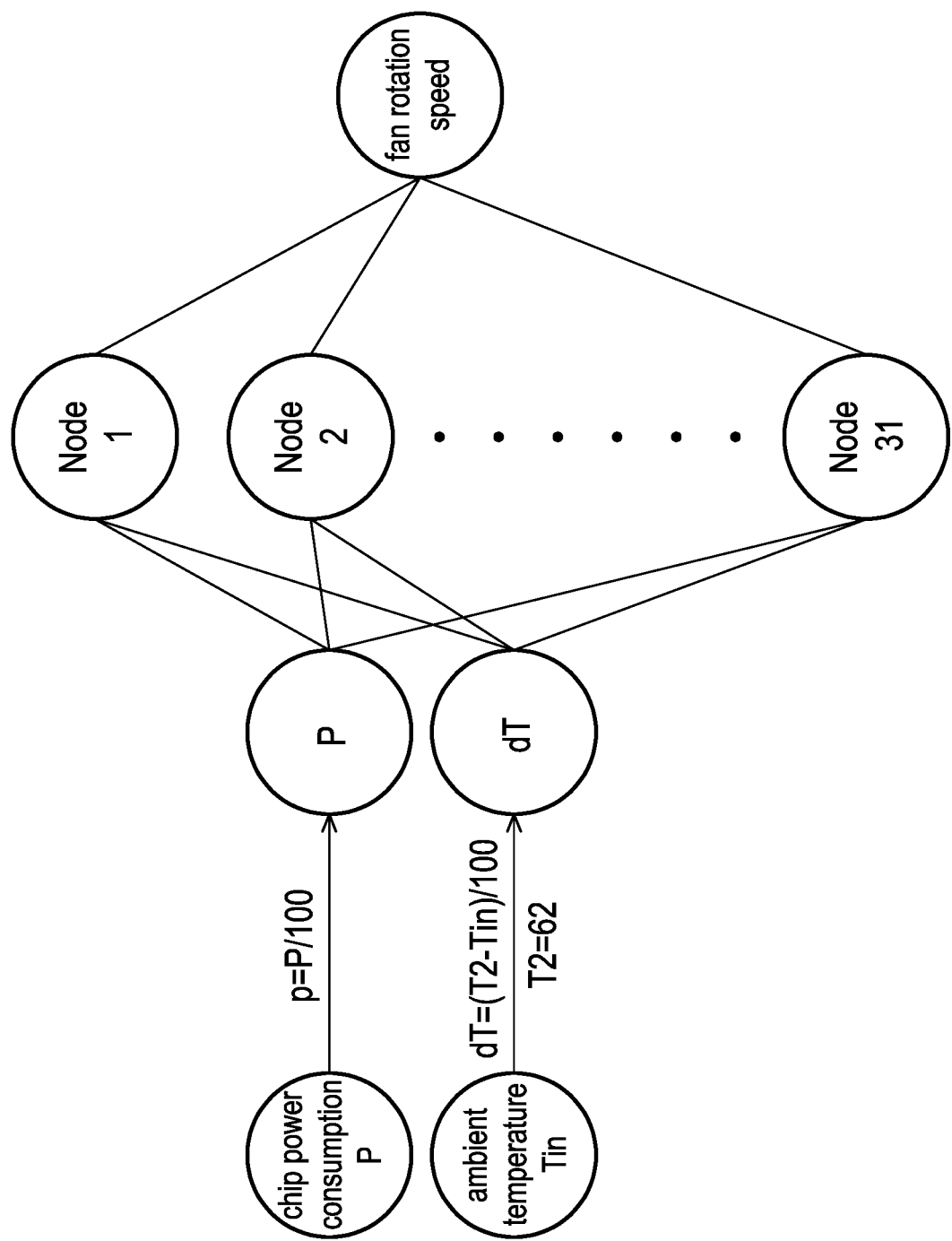
FIG. 5 is a conceptual diagram of a neural network corresponding to an open loop circuit in FIG. 4.
Figure 6:
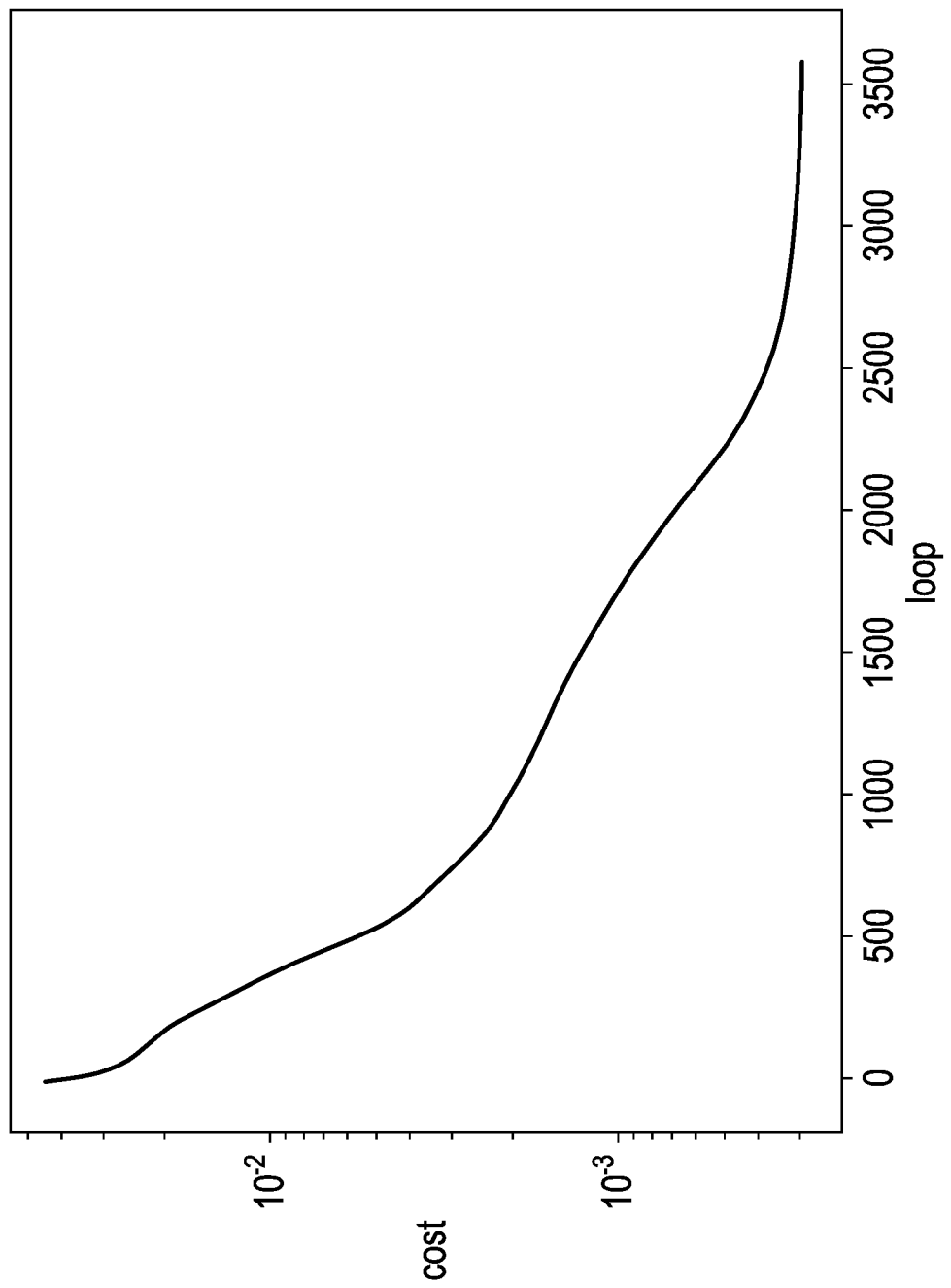
FIG. 6 is a loss function diagram after training according to the neural network in FIG. 5.

FIG. 5 is a conceptual diagram of a neural network corresponding to the open loop circuit in FIG. 4. FIG. 6 is a loss function diagram after training according to the neural network in FIG. 5. In detail, for the aforementioned open loop control, the control model thereof is obtained by, for example, training through the neural network shown in FIG. 5 to dynamically adjust the heat dissipation module 120, with input conditions such as power consumption P of the chip (the heat generating element 110) and an ambient temperature Tin (or an ambient pressure may also be included) shown in FIG. 5. The neural network is, for example, 31 nodes (Node 1 to Node 31), using ReLU as the hidden layer activation function and an identity function as the output layer function. In addition, the Adam optimizer is used, and the learning rate is set to 0.001, with $\beta 1=0.9$ and $\beta 2=0.999$. In order to improve training convergence, normalization may be performed on input data first, with Node 1 input as p and Node 2 input as dT. Here, the second target temperature T2 is set to, for example, 62 degrees Celsius.

The training data set of the neural network is shown in Table 1 below, and the loss function obtained after 3500 steps of training is reduced to below 0.0003 as shown in FIG. 6.

TABLE 1

| Ambient temperature (° C.) | CPU power consumption (W) | Actual fan rotation speed requirement (% duty) |
|---|---|---|
| 25 | 95 | 62 |
| 28 | 95 | 100 |
| 25 | 71 | 37 |
| 35 | 71 | 100 |
| 25 | 47.5 | 20 |
| 35 | 47.5 | 46 |

According to the above training results, the control unit 130 uses the open loop circuit 132 to control the heat dissipation module 120 and obtain the verification data set shown in Table 2 below. According to Table 2, the coefficient of determination between the fan rotation speed predicted by the model and the actual fan rotation speed requirement is greater than 0.91, which is close to the optimal value (1.0).

TABLE 2

| Ambient temperature (° C.) | chip power consumption (W) | Actual fan rotation speed requirement (% duty) | Fan rotation speed predicted by model (% duty) |
|---|---|---|---|
| 25 | 80.5 | 50 | 47 |
| 28 | 60 | 40 | 38 |
| 30 | 47.5 | 28 | 33 |
| 30 | 50 | 35 | 35 |
| 30 | 71 | 57 | 60 |

The training method listed above is only for exemplification. In other embodiments, the open loop control may be trained by other methods, and the disclosure is not limited thereto.

In this embodiment, the electronic apparatus 100 includes a sensing module 140 as shown in FIG. 1, which together with the control unit 130 may be regarded as a dynamic heat dissipation control system for controlling the process of the heat dissipation method in FIG. 3. Specifically, the sensing module 140 is coupled to the control unit 130 and is adapted for sensing the power consumption of the heat generating element 110 and the temperature of the heat generating element 110, such that the control unit 130 may control the heat dissipation module 120 according to the power consumption of the heat generating element 110 and the temperature of the heat generating element 110 as described above. The sensing module 140 may include multiple types of sensors respectively used to sense the power consumption of the heat generating element 110, the temperature of the heat generating element 110, the ambient temperature, and the ambient pressure, which are not limited by the disclosure.

Figure 7:
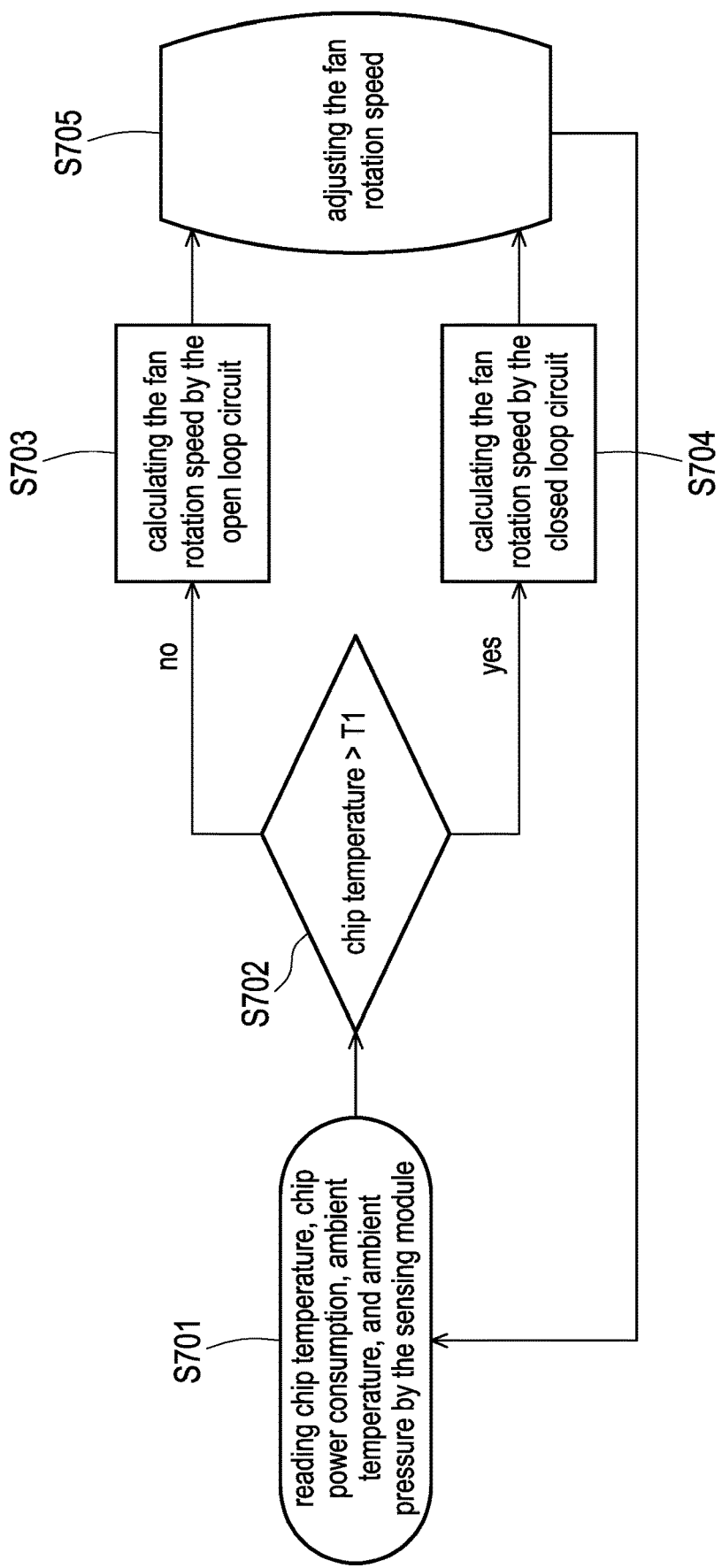
FIG. 7 is a detailed flow of the electronic apparatus controlling the fan rotation speed in FIG. 1.

A detailed flow of controlling the fan rotation speed in this embodiment is described below with the drawing. FIG. 7 illustrates the detailed flow of the electronic apparatus controlling the fan rotation speed in FIG. 1. With reference to FIG. 7, the sensing module 140 reads the temperature and power consumption of the chip (the heat generating element 110), the ambient temperature, and the ambient pressure (step S701). Next, it is determined whether the temperature of the chip is greater than the first target temperature T1 (step S702). If the temperature of the chip is not greater than the first target temperature T1, the open loop circuit 132 is used to calculate the fan (the heat dissipation module 120) rotation speed (step S703) and adjust the fan rotation speed accordingly (step S705). If the temperature of the chip is greater than the first target temperature T1, the closed loop circuit 134 is used to calculate the fan rotation speed (step S704) and adjust the fan rotation speed accordingly (step S705). The closed loop circuit 134 here is, for example, a proportional-integral and derivative (PID) control unit.

As described above, in the first temperature variation state TS1 where the temperature increases rapidly, the fan rotation speed is controlled in the open loop manner, instead of in the closed loop PID manner. In this way, it may be avoided that unoptimized PID parameters lead to an excessively low rate of variation in the fan rotation speed, which results in a temperature overshoot of the heat generating element. In addition, it may be avoided that unoptimized PID parameters leads to an excessively high rate of variation in the fan rotation speed, which results in an oscillation of rotational speed. In following the above, since a certain degree of error (e.g., an error within 5%) still exists in the open loop control, when the temperature of the chip is greater than the first target temperature T1, the closed loop PID control unit, instead, adjusts the fan rotation speed, such that the chip temperature may approach the second target temperature T2 in a favorable way. Therefore, the electronic apparatus 100 may have good performance with power saving and noise reduction effects.

Figure 8:
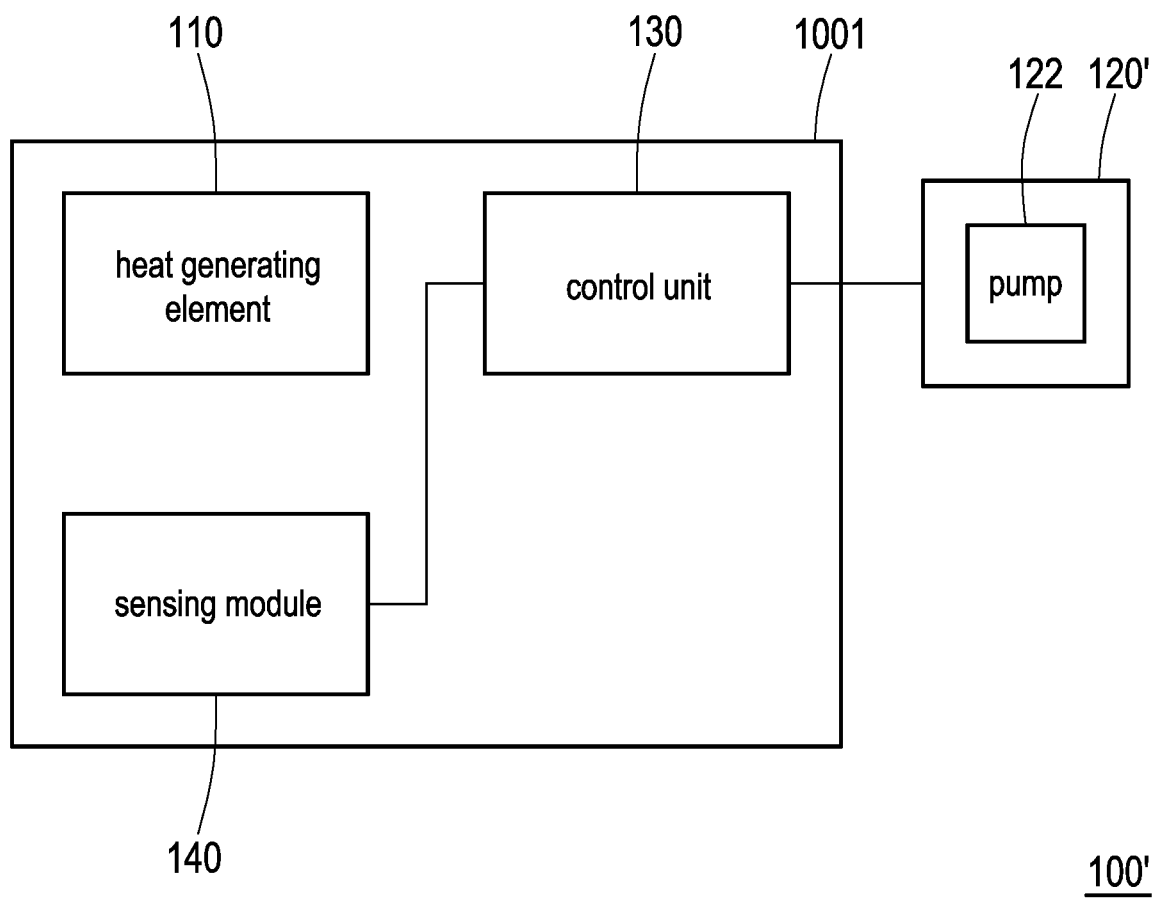
FIG. 8 is a schematic diagram of an electronic apparatus according to another embodiment of the disclosure.

The disclosure does not limit the type of the heat dissipation module 110. The heat dissipation module 110 may be a fan as described above or may also be a heat dissipation module such as a water-cooling pump in a server body. In addition, the heat dissipation module may not be a component in the server body, which is exemplified below. FIG. 8 is a schematic diagram of an electronic apparatus according to another embodiment of the disclosure. The difference between an electronic apparatus 100' shown in FIG. 8 and the electronic apparatus 100 shown in FIG. 1 is that a heat dissipation module 120' of the electronic apparatus 100' is a coolant distribution unit (CDU) externally connected to the body 1001 of the electronic apparatus 100, and the operation state of the heat dissipation module 120' is the rotation speed of the pump 122 therein. In other embodiments, the heat dissipation module may be a device of other type, and the disclosure is not limit thereto.

What is claimed is:

1. An electronic apparatus, comprising:
a heat generating element;
a heat dissipation module, adapted for performing heat dissipation on the heat generating element; and
a control unit, coupled to the heat dissipation module, wherein the control unit is adapted for measuring temperature variation of at least one temperature module and state variation of at least one system component, and is adapted for adjusting the heat dissipation module via a control signal based on the state variation and the temperature variation,
the control unit is combined with a neural network to dynamically adjust the heat dissipation module, the control unit comprises an open loop circuit, and the open loop circuit dynamically adjusts the heat dissipation module according to a control model obtained by training through the neural network,
wherein the training of the neural network is at least according to a function of an ambient temperature and a target temperature.

2. The electronic apparatus according to claim 1, wherein the temperature variation of the at least one temperature module corresponds to temperature variation of the heat generating element, the state variation of the at least one system component corresponds to power consumption variation of the heat generating element, the control unit controls an operation state of the heat dissipation module according to the power consumption variation of the heat generating element in a first temperature variation state of the heat generating element, and the control unit controls the operation state of the heat dissipation module according to the temperature variation of the heat generating element in a second temperature variation state of the heat generating element, wherein the first temperature variation state is a first heating state, and the second temperature variation state is a second heating state.

3. The electronic apparatus according to claim 2, wherein the heat generating element heats up from an initial temperature to a first target temperature in the first temperature variation state, and the heat generating element heats up from the first target temperature to a second target temperature in the second temperature variation state.

4. The electronic apparatus according to claim 2, wherein the control unit comprises a closed loop circuit, the control unit controls the operation state of the heat dissipation module via the open loop circuit in the first temperature variation state, and the control unit controls the operation state of the heat dissipation module via the closed loop circuit in the second temperature variation state.

5. The electronic apparatus according to claim 4, wherein when a temperature of the heat generating element is not greater than a first target temperature, the control unit controls the operation state of the heat dissipation module via the open loop circuit, and when the temperature of the heat generating element is greater than the first target temperature, the control unit controls the operation state of the heat dissipation module via the closed loop circuit, such that the temperature of the heat generating element approaches a second target temperature, which is greater than the first target temperature.

6. The electronic apparatus according to claim 2, wherein the heat dissipation module is a fan, the fan and the heat generating element are disposed in a body of the electronic apparatus, and the operation state of the heat dissipation module is a rotation speed of the fan.

7. The electronic apparatus according to claim 2, wherein the heat dissipation module is a coolant distribution device, the heat generating element is disposed in a body of the electronic apparatus, the coolant distribution device is externally connected to the body, and the operation state of the heat dissipation module is a rotation speed of a pump of the coolant distribution device.

8. The electronic apparatus according to claim 2, wherein the heat dissipation module is a water-cooling pump, the water-cooling pump and the heat generating element are disposed in a body of the electronic apparatus, and the operation state of the heat dissipation module is a rotation speed of the water-cooling pump.

9. The electronic apparatus according to claim 1, comprising a sensing module, wherein the sensing module is coupled to the control unit, and the sensing module is adapted for sensing power consumption of the heat generating element and a temperature of the heat generating element.

10. A dynamic control heat dissipation method, adapted for an electronic apparatus, the dynamic control heat dissipation method comprising:
measuring temperature variation of at least one temperature module and state variation of at least one system component;
adjusting a heat dissipation module via a control signal based on the state variation and the temperature variation;
controlling the heat dissipation module by a control unit; and
combining a neural network to dynamically adjust the heat dissipation module, wherein the open loop circuit dynamically adjusts the heat dissipation module according to a control model obtained by training through the neural network,
wherein the training of the neural network is at least according to a function of an ambient temperature and a target temperature.

11. The dynamic control heat dissipation method according to claim 10, comprising:
performing heat dissipation on a heat generating element of the electronic apparatus by using the heat dissipation module, wherein the temperature variation of the at least one temperature module corresponds to temperature variation of the heat generating element, and the state variation of the at least one system component corresponds to power consumption variation of the heat generating element;
controlling an operation state of the heat dissipation module according to the power consumption variation of the heat generating element by using the control unit in a first temperature variation state of the heat generating element; and
controlling the operation state of the heat dissipation module according to the temperature variation of the heat generating element by using the control unit in a second temperature variation state of the heat generating element.

12. The dynamic control heat dissipation method according to claim 11, wherein the first temperature variation state is a first heating state, and the second temperature variation state is a second heating state.

13. The dynamic control heat dissipation method according to claim 11, wherein the heat generating element heats up from an initial temperature to a first target temperature in the first temperature variation state, and the heat generating element heats up from the first target temperature to a second target temperature in the second temperature variation state.

14. The dynamic control heat dissipation method according to claim 11, wherein the control unit comprises a closed loop circuit, the control unit controls the operation state of the heat dissipation module via the open loop circuit in the first temperature variation state, and the control unit controls the operation state of the heat dissipation module via the closed loop circuit in the second temperature variation state.

15. The dynamic control heat dissipation method according to claim 14, wherein when a temperature of the heat generating element is not greater than a first target temperature, the control unit controls the operation state of the heat dissipation module via the open loop circuit, and when the temperature of the heat generating element is greater than the first target temperature, the control unit controls the operation state of the heat dissipation module via the closed loop circuit, such that the temperature of the heat generating element approaches a second target temperature, which is greater than the first target temperature.

16. The dynamic control heat dissipation method according to claim 11, comprising sensing at least one of power consumption of the heat generating element, a temperature of the heat generating element, the ambient temperature, and an ambient pressure by using a sensing module.

17. A dynamic heat dissipation control system, adapted for a heat dissipation module of an electronic apparatus, wherein the heat dissipation module is adapted for performing heat dissipation on a heat generating element of the electronic apparatus, the control system comprising:

a control unit, coupled to the heat dissipation module and adapted for measuring temperature variation of at least one temperature module and state variation of at least one system component, and for adjusting a heat dissipation module via a control signal based on the state variation and the temperature variation, wherein the control unit is combined with a neural network to dynamically adjust the heat dissipation module, the control unit comprises an open loop circuit, and the open loop circuit dynamically adjusts the heat dissipation module according to a control model obtained by training through the neural network;

the temperature variation of the at least one temperature module corresponds to temperature variation of the heat generating element, the state variation of the at least one system component corresponds to power consumption variation of the heat generating element, the control unit controls an operation state of the heat dissipation module according to the power consumption variation of the heat generating element in a first temperature variation state of the heat generating element, and the control unit controls the operation state of the heat dissipation module according to the temperature variation of the heat generating element in a second temperature variation state of the heat generating element; and the first temperature variation state is a first heating state, and the second temperature variation state is a second heating state, wherein the training of the neural network is at least according to a function of an ambient temperature and a target temperature.

* * * * *